(12) United States Patent
Morita et al.

(10) Patent No.: US 7,382,217 B2
(45) Date of Patent: Jun. 3, 2008

(54) SURFACE ACOUSTIC WAVE DEVICE

(75) Inventors: Takao Morita, Tatsuno-machi (JP); Takuya Owaki, Minowa-machi (JP)

(73) Assignee: Epson Toyocom Corporation, Kanagawa (JP)

( * ) Notice: Subject to any disclaimer, the term of this patent is extended or adjusted under 35 U.S.C. 154(b) by 40 days.

(21) Appl. No.: 11/291,910

(22) Filed: Dec. 2, 2005

(65) Prior Publication Data
US 2006/0145568 A1    Jul. 6, 2006

(30) Foreign Application Priority Data
Dec. 3, 2004   (JP) ............... 2004-351012
Jan. 19, 2005  (JP) ............... 2005-011286

(51) Int. Cl.
*H03H 9/19*    (2006.01)

(52) U.S. Cl. ............... 333/195; 310/313 A; 310/313 D

(58) Field of Classification Search ........ 333/193–196; 310/313 A–313 D
See application file for complete search history.

(56) References Cited

U.S. PATENT DOCUMENTS

| | | | |
|---|---|---|---|
| 4,387,355 A * | 6/1983 | Uno et al. ............... | 333/195 |
| 4,965,479 A | 10/1990 | Elliott et al. | |
| RE35,204 E * | 4/1996 | Lewis .................... | 310/313 A |
| 6,369,667 B1 * | 4/2002 | Kadota et al. ............. | 333/133 |
| 6,437,668 B1 | 8/2002 | Nakao et al. | |
| 6,710,509 B1 * | 3/2004 | Kadota .................... | 310/313 A |
| 6,946,930 B2 | 9/2005 | Kadota et al. | |
| 2005/0062560 A1 * | 3/2005 | Oshio .................... | 333/195 |
| 2005/0122188 A1 * | 6/2005 | Funasaka et al. .......... | 333/193 |

FOREIGN PATENT DOCUMENTS

| | | |
|---|---|---|
| EP | 1 061 646 A1 | 12/2000 |
| GB | 1 591 624 | 6/1981 |
| JP | 53-105394 | 9/1978 |
| JP | A-55-45284 | 3/1980 |

(Continued)

OTHER PUBLICATIONS

Josse, "Temperature Dependence of SH-Wave on Roated Y-Cut Quartz with SiO2 Overlay," IEEE trans. on Sonics and Ultrasonics, vol. SU-31, No. 3, May 1984, pp. 162-168.*

(Continued)

*Primary Examiner*—Seungsook Ham
(74) *Attorney, Agent, or Firm*—Oliff & Berridge, PLC

(57) ABSTRACT

A surface acoustic wave device is provided. The surface acoustic wave device includes a piezoelectric substrate and an IDT which is disposed on the piezoelectric substrate and made of Al or an alloy containing Al as a main component and using an SH wave as an excitation wave, wherein the piezoelectric substrate is a rotated Y-cut quartz plate having a cut angle $\theta$ set to a range of $-64.0° < \theta < -49.3°$ rotated counterclockwise from a Z crystalline axis and a propagation direction of a surface acoustic wave set to a direction of $90°\pm5°$ with respect to an X crystalline axis, wherein, when a wavelength of an excited surface acoustic wave is denoted by $\lambda$, an electrode film thickness $H/\lambda$ normalized with wavelength of the IDT is set to a range of $0.04 < H/\lambda < 0.12$, and wherein, when a line occupancy rate mr of electrode fingers constituting the IDT is defined to be electrode finger width/(electrode finger width+electrode finger spacing), the line occupancy rate mr is set to a range of $0.53 \leq mr \leq 0.65$.

17 Claims, 13 Drawing Sheets

FOREIGN PATENT DOCUMENTS

| | | |
|---|---|---|
| JP | 58006618 A * | 1/1983 |
| JP | 58-033309 | 2/1983 |
| JP | 62-16050 | 4/1987 |
| JP | A-7-46079 | 2/1995 |
| JP | A-2000-323955 | 11/2000 |
| JP | A 2001-68959 | 3/2001 |
| JP | A-2002-330051 | 11/2002 |
| JP | A-2004-328387 | 11/2004 |
| WO | WO-A-2005-099089 A1 | 10/2005 |

OTHER PUBLICATIONS

Surface Skimming Bulk Waves, SSBW; Meirion Lewis, Royal Signals and Radar Establishment, Malvern, Worcs, U.K.; pp. 744-752, 1977.

* cited by examiner

|  | PRODUCT OF THE INVENTION | CONVENTIONAL PRODUCT (ST CUT QUARTZ) | UNITS |
|---|---|---|---|
| Q VALUE | 27500 | 15000 | - |
| FIGURE OF MERIT | 21.2 | 10.7 | - |
| SECONDARY TEMPERATURE COEFFICIENT | -0.020 | -0.034 | ppm/°C$^2$ |

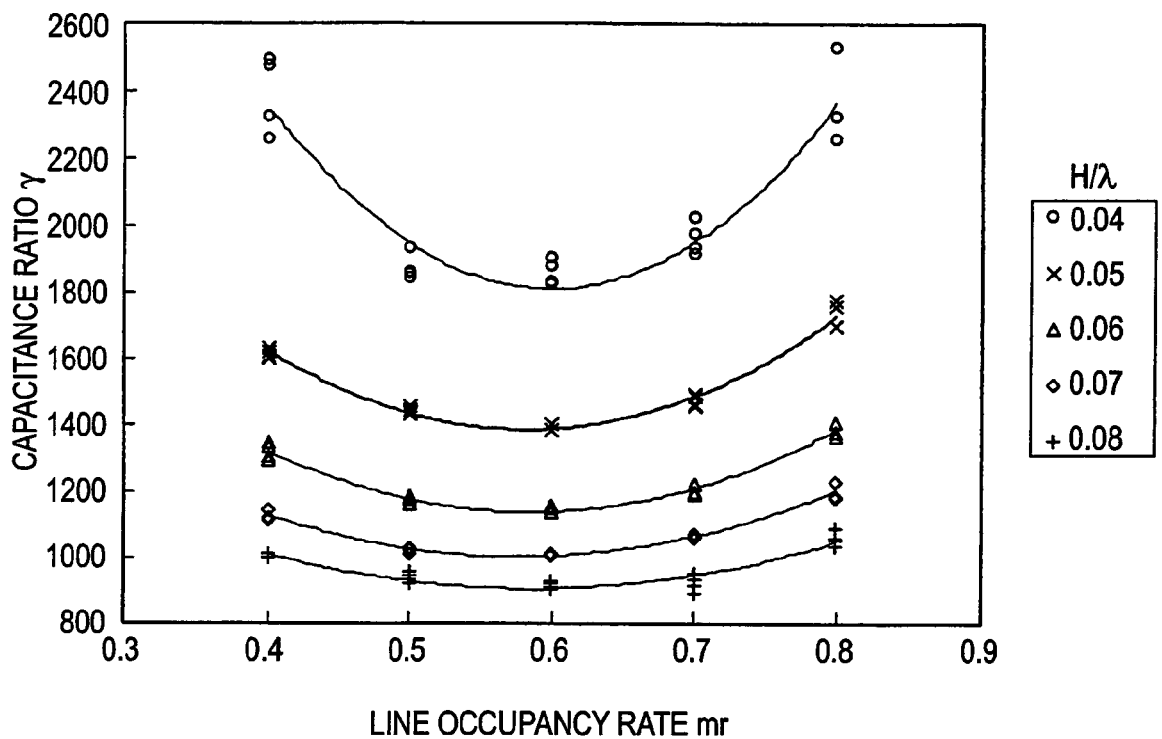

| ELECTRODE THICKNESS H/λ | LINE OCCUPANCY RATE mr AT LOWEST RESONANCE FREQUENCY f |
|---|---|
| 0.04 | 0.60 |
| 0.05 | 0.61 |
| 0.06 | 0.62 |
| 0.07 | 0.63 |
| 0.08 | 0.62 |

SURFACE ACOUSTIC WAVE DEVICE

BACKGROUND

1. Technical Field

The present invention relates to a surface acoustic wave device using a quartz plate, and more particularly, to a surface acoustic wave device capable of improving a frequency control performance by reducing a capacitance ratio.

2. Related Art

Recently, surface acoustic wave (hereinafter, referred to as a SAW) devices have been widely used as parts for mobile communication terminals or built-in vehicle apparatuses. The SAW devices have been required to have a small size, a high Q value, and excellent frequency temperature characteristics.

As a SAW device stratifying the requirement, there is a SAW device using an ST cut quartz plate. The ST cut quartz plate is a name of a cut quart plate having a plane (XZ' plane) which is formed by rotating an XZ plane by 42.75° counterclockwise from an Z crystalline axis about an X crystalline axis as a rotation axis, and the SAW device uses a SAW (hereinafter, referred to as an ST cut quartz SAW) which is a (P+SV) wave, that is, a so-called Rayleigh wave propagating in a direction of the X crystalline axis. The ST cut quartz SAW device may be widely applied to an SAW resonator used as an oscillation frequency element, an IF filer disposed between RF ports and ICs in a mobile communication terminal, or the like.

Since it is possible to efficiently use the reflection of the SAW, the size of the ST cut quartz SAW device can be reduced, and a device having a high Q value can be implemented. Now, an ST cut quartz SAW resonator shown in FIG. 12 is exemplified. The ST cut quartz SAW resonator has a structure where comb-like electrodes (hereinafter, referred to as an IDT) having a plurality of lines of electrode fingers which are alternately inserted are disposed on an ST cut quartz plate 101, and grating reflectors 103a and 103b reflecting the SAW are disposed at both sides of the IDTs 102. Since the ST cut quartz SAW is a wave propagating along a surface of the piezoelectric substrate, the ST cut quart SAW can be efficiently reflected on the grating reflectors 103a and 103b, so that the SAW energy can be sufficiently held within the IDTs 102. As a result, the device having a small size and a high Q value can be implemented.

In addition, as the important factors in use of the SAW device, there are frequency temperature characteristics. In the aforementioned ST cut quartz SAW, a first-order temperature coefficient of the frequency temperature characteristics is zero, and the characteristics are represented by a quadratic curve. Since the frequency variation can be greatly reduced by adjusting a peak temperature to a center of a usage temperature range, it is generally known that frequency stability thereof is excellent.

Although the first-order temperature coefficient is zero, a secondary temperature coefficient of the ST cut quartz SAW device has a relatively large value of $-0.034$ ppm/° $C.^2$, so that there is a problem in that, if the usage temperature range is widened, the frequency variation increases extremely.

As a technique for solving the above problem, there are SAW devices disclosed in the article "Surface Skimming Bulk Wave, SSBW" (by Meirion Lewis, IEEE Ultrasonics Symp. Proc., pp. 744-752 (1977)) and JP-B-62-016050. As shown in FIGS. 13A and 13B, in the SAW device, a cut angle $\theta$ of a rotated Y-cut quartz plate is set to a vicinity of an angle rotated by $-50°$ counterclockwise from a Z crystalline axis, and a propagation direction of the SAW is set to a direction (direction of a Z' axis) perpendicular to the propagation direction of the SAW. In addition, the aforementioned cut angle can be represented with (0°, θ90°, 90°)=(0°, 40°, 90°). The SAW utilizes the IDT to excite the SH wave propagating along a portion directly underlying a surface of the piezoelectric substrate, and the vibration energy can be held within a portion directly underlying the electrode. In addition, the frequency temperature characteristics are represented with a quartic curve, and the frequency variation is very small in the usage temperature range, so that excellent temperature characteristics can be obtained.

However, since the SH wave is basically a wave attenuating into an inner portion of the plate, the reflection efficiency of the grating reflector for the SAW is low in comparison to the ST cut quartz wave propagating along the surface of the piezoelectric substrate. Therefore, there is a problem in that it is difficult to implement a SAW device having a small size and a high Q value. Although an application as a retardation line which the reflection of the SAW is not utilized for is disclosed in the aforementioned prior documents, any application of a device utilizing the reflection of the SAW is not disclosed. Therefore, there is a problem in that it is difficult to implement a practical oscillation frequency element or filter element.

In order to solve the above problem, a so-called multiple-pair IDT type SAW resonator is disclosed in JP-B-01-034411. As shown in FIG. 14, in the multiple-pair IDT type SAW resonator, a large number of pairs, that is, 800±200 pairs of IDTs 112 are disposed on a piezoelectric substrate 111 which has the cut angle θ of the rotated Y-cut quartz plate set to a vicinity of $-50°$ and a propagation direction of the SAW set to a direction (a direction of the Z' axis) perpendicular to the X crystalline axis. Accordingly, the SAW energy can be held by means of only the reflection of the IDT 112 without using any grating reflector, so that a multiple-pair IDT type SAW resonator having a high Q value can be implemented.

However, in comparison to the SAW resonator utilizing the grating resonator, the multiple-pair IDT type SAW resonator can not efficiently hold the energy, so that the number of IDT pairs increase up to 800±200 in order to obtain a high Q value. Therefore, the size thereof is larger than that of the ST cut quartz SAW resonator, there is a problem in that a recent requirement for a small size can not be satisfied.

In the SAW resonator disclosed in the aforementioned JP-B-01-034411, when a wavelength of the SAW excited in the is denoted by λ, the Q value can be increased by setting the electrode film thickness to 2% λ or more, preferably, 4% λ or less. In case of a resonance frequency of 200 MHz, the Q value is saturated at a vicinity of 4% λ, and at this time, the Q value is merely about 20000, which is substantially equal to that of the ST cut quartz SAW resonator. This is because the SAW is not sufficiently held within the surface of the piezoelectric substrate when the film thickness is in a range of 2% λ to 4% λ. Therefore, the reflection thereof can not efficiently used.

For these reasons, it is conceivable to provide a SAW device wherein IDTs made of Al or an alloy containing Al as a main component are disposed on a rotated Y-cut quartz plate having a cut angle θ set to a range of $-64.0°<\theta<-49.3°$, preferably, $-61.4°<\theta<-51.1°$ rotated counterclockwise from a Z crystalline axis and a propagation direction of the surface acoustic wave set to a direction of 90°±5° with respect to an X crystalline axis and wherein an electrode film thickness H/λ of the IDT normalized with a wavelength of the SAW is set to $0.04<H/\lambda<0.12$, preferably, $0.05<H/\lambda<0.10$.

According to the invention, the wave attenuating into the inner portion of the piezoelectric substrate is concentrated on the surface of the plate, so that the reflection of the SAW can be efficiently used. As a result, it is possible to implement an SAW device having a smaller size, a higher Q value, and more excellent frequency temperature characteristics than those of the ST cut quartz SAW device in the related art.

On the other hand, as an important factor for determining characteristics of the SAW device such as the SAW resonator and the SAW filter, there is a capacitance ratio γ. FIG. 15 shows an equivalent circuit diagram of an SAW resonator, and the capacitance ratio γ is represented by γ=C0/C1. As the capacitance ratio γ decreases, oscillation of the oscillating circuit using the SAW resonator can be further facilitated, so that it is possible to obtain a wide variable range of oscillation frequency and to widen a practical band width of the SAW filter.

The capacitance ratio γ may vary greatly according to an occupancy rate (hereinafter, referred to as a line occupancy rate mr) of an electrode finger width L to the electrode pitch (electrode finger width L+ electrode finger spacing S) of the IDT. Therefore, if the line occupancy rate mr of the IDT is not suitably selected, the capacitance ratio γ may be too large to obtain desired characteristics. However, since the capacitance ratio γ may not be conceived in the aforementioned conceivable SAW device, there is a need to scrutinize a relation between the capacitance ratio γ and the line occupancy rate mr in detail.

In addition, during a production process of the SAW device, it is difficult to accurately control the line occupancy rate mr, so that there occurs a deviation caused by production error or measurement error during the formation of the electrodes. If the line occupancy rate mr is not uniform, the frequency variation occurs, so that production yield is reduced. Therefore, the line occupancy rate mr is needed to be suitably selected in order to obtain excellent frequency control performance. However, the frequency control performance may not be conceived in the aforementioned conceivable SAW device, there is also a need to scrutinize a relation between the capacitance ratio γ and the frequency control performance in detail.

In addition, in the aforementioned conceivable SAW device, as a result of an electrical conduction test using the SAW resonator at a resonance frequency 433 MHz, the frequency variation during the electrical conduction further increases in comparison to a ST cut quartz SAW device in the related art. The reason is as follows. In the aforementioned conceivable SAW device, the electrode film thickness is larger than that of a ST cut quartz device in the related art. If the electrode film thickness is large, stress to a film during the formation of the film increases, so that there occurs stress migration that Al atoms migrates so as to alleviate the stress. Accordingly, frequency variation increases. In addition, if the electrode film thickness is reduced in order to avoid the frequency variation, the Q value is greatly lowered, so that there is a problem in that an insertion loss during the formation of a filter or the like increases.

SUMMARY

Advantage of the invention is to provide a SAW device capable of obtaining a small size, a high Q value, and excellent frequency temperature characteristics and reducing capacitance ratio γ to improve a frequency control performance and suppress a frequency variation during an electrical conduction by using a quartz plate as a piezoelectric substrate and using an SH wave.

According to an aspect of the invention, there is provided a surface acoustic wave device comprising a piezoelectric substrate and an IDT which is disposed on the piezoelectric substrate and made of Al or an alloy containing Al as a main component and using an SH wave as an excitation wave, wherein the piezoelectric substrate is a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger width/(electrode finger width+electrode finger spacing), the line occupancy rate mr is set to a range of 0.53≦mr≦0.65.

According to another aspect of the invention, there is provided a surface acoustic wave device comprising a piezoelectric substrate and an IDT which is disposed on the piezoelectric substrate and made of Al or an alloy containing Al as a main component and using an SH wave as an excitation wave, wherein the piezoelectric substrate is a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger width/(electrode finger width+electrode finger spacing), the line occupancy rate mr is set to a range of 0.55≦mr≦0.68.

According to still another aspect of the invention, there is provided a surface acoustic wave device comprising a piezoelectric substrate and an IDT which is disposed on the piezoelectric substrate and made of Al or an alloy containing Al as a main component and using an SH wave as an excitation wave, wherein the piezoelectric substrate is a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger width/(electrode finger width+electrode finger spacing), the line occupancy rate mr is set to a range of 0.55≦mr≦0.65.

In the above aspects of the invention, it is preferable that the cut angle θ is set to a range of −61.4°<θ<−51.1°.

In the above aspects of the invention, it is preferable that the electrode film thickness H/λ is set to a range of 0.05<H/λ<0.10.

In the above aspects of the invention, it is preferable that the electrode film thickness H/λ is set to a range of 0.04≦H/λ≦0.08.

According to further still another aspect of the invention, there is provided a surface acoustic wave device comprising a piezoelectric substrate and an IDT which is disposed on the piezoelectric substrate and made of Al or an alloy containing Al as a main component and using an SH wave as an excitation wave, wherein the piezoelectric substrate is a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, and wherein grooves are formed in spaces between electrode fingers of the IDT, and when a depth of the grooves and a film thickness of a metal film are denoted by Hp and Hm, respectively, an electrode film thickness H/λ normalized with wavelength of the IDT is set to a range of 0.04<H/λ<0.12 (H=Hp+Hm).

According to further still another aspect of the invention, there is provided a module apparatus or an oscillating circuit using the surface acoustic wave device according to the above aspects of the invention.

In the SAW device according to the above aspect of the invention, wherein the IDT made of Al or an alloy containing Al as a main component is disposed on the quartz plate where the cut angle θ of the rotated Y-cut quartz plate is set to a range of −64.0°<θ<−49.3° rotated counterclockwise from the Z crystalline axis and the propagation direction of the surface acoustic wave is set to a direction of 90°±5° with respect to the X crystalline axis, and wherein the electrode film thickness H/λ normalized with wavelength of the IDT is set to a range of 0.04<H/λ<0.12, since the line occupancy rate mr of the IDT is set to a range of 0.53≦mr≦0.65, it is possible to reduce the capacitance ratio γ. As a result, it is possible to obtain a high Q value and excellent frequency temperature characteristics. In addition, it is possible to implement a wide band width of an SAW filter. In addition, oscillation of an oscillating circuit using the SAW resonator can be facilitate, so that it is possible to widen a variable range of oscillation frequency.

In the SAW device according to the above aspect of the invention, wherein the IDT made of Al or an alloy containing Al as a main component is disposed on the quartz plate where the cut angle θ of the rotated Y-cut quartz plate is set to a range of −64.0°<θ<−49.3° rotated counterclockwise from the Z crystalline axis and the propagation direction of the surface acoustic wave is set to a direction of 90°±5° with respect to the X crystalline axis, and wherein the electrode film thickness H/λ normalized with wavelength of the IDT is set to a range of 0.04<H/λ<0.12, since the line occupancy rate mr of the IDT is set to a range of 0.53≦mr≦0.68, it is possible to improve frequency control performance. As a result, even in a case where the line occupancy rate mr is not uniform during the production of the SAW device, since the frequency variation can be suppressed, it is possible to reduce production difficulty and production cost.

In the SAW device according to the above aspect of the invention, wherein the IDT made of Al or an alloy containing Al as a main component is disposed on the quartz plate where the cut angle θ of the rotated Y-cut quartz plate is set to a range of −64.0°<θ<−49.3° rotated counterclockwise from the Z crystalline axis and the propagation direction of the surface acoustic wave is set to a direction of 90°±5° with respect to the X crystalline axis, and wherein the electrode film thickness H/λ normalized with wavelength of the IDT is set to a range of 0.04<H/λ<0.12, since the line occupancy rate mr of the IDT is set to a range of 0.55≦mr≦0.65, it is possible to implement a SAW device having an optimal capacitance ratio γ and an optimal frequency control performance.

In the SAW device according to the above aspect of the invention, since the cut angle θ is set to a range of −61.4<θ<−51.1, the peak temperature Tp (° C.) can be set to a practical temperature range.

In the SAW device according to the above aspect of the invention, since the electrode film thickness H/λ is set to a range of 0.05<H/λ<0.10, preferably, 0.04≦H/λ≦0.08, it is possible to increase the Q value.

In the SAW device according to the above aspect of the invention, the grooves are formed in spaces between electrode fingers of the IDT, and when a depth of the grooves and a film thickness of a metal film are denoted by Hp and Hm, respectively, the electrode film thickness H/λ normalized with wavelength of the IDT is set to a range of 0.04<H/λ<0.12 (H=Hp+Hm), so that it is possible to reduce the film thickness of the metal film in comparison to the aforementioned conceivable SAW device. As a result, it is possible to suppress the frequency variation caused by stress migration during the electrical conduction and to implement a SAW device having a high Q value and excellent frequency temperature characteristics.

In the module apparatus or the oscillating circuit according to the above aspect of the invention, since the aforementioned SAW device is used, it is possible to implement a module apparatus or an oscillating circuit having a small size and a high performance.

BRIEF DESCRIPTION OF THE DRAWING

The invention will be described with reference to the accompanying drawings, wherein like numbers reference like elements and wherein:

FIG. 5A is a graph showing a relation between a line occupancy rate mr and a capacitance ratio γ when an electrode film thickness H/λ of the SAW resonator according to the invention changes, and FIG. 5B is a table showing line occupancy rates mr at minimum capacitance ratios γ in conditions of the electrode film thickness H/λ.

DESCRIPTION OF EXEMPLARY EMBODIMENTS

Figure 1A:
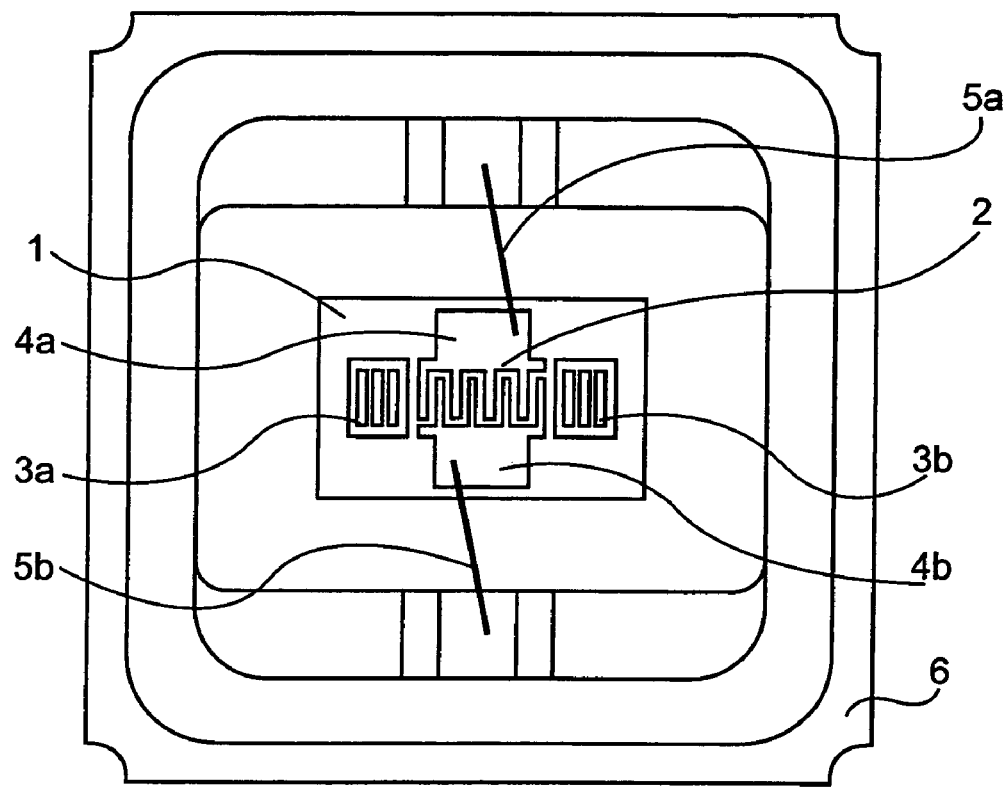
FIG. 1A is a plan view showing the SAW resonator according to the invention.
Figure 1B:
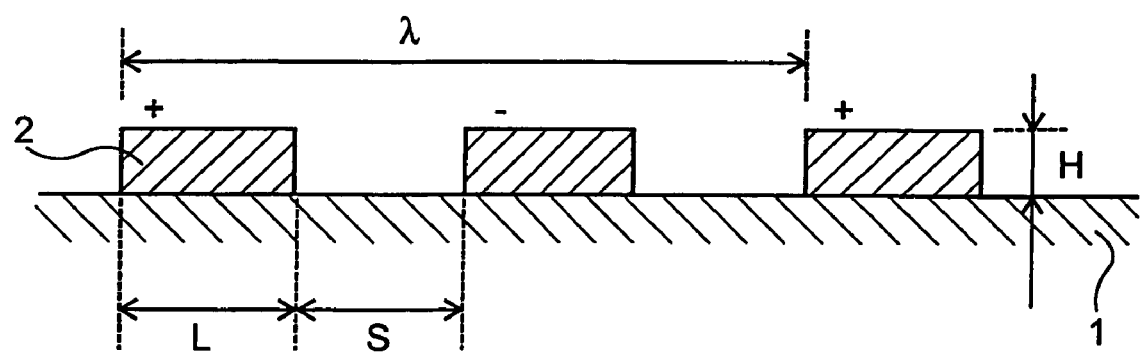
FIG. 1B is a cross sectional view showing an IDT in the SAW resonator.

Hereinafter, the present invention will be described with reference to the accompanying drawings. FIG. 1A is a plan view showing an SAW resonator according to the invention. An IDT 2 constructed by alternately inserting positive electrode fingers and negative electrode fingers and grating reflectors 3a and 3b which reflect SAW at sides of the IDT 2 are disposed on a piezoelectric substrate 1. Input/output pads 4a and 4b of the IDT 2 and input/output terminals of a package 6 are electrically connected with metal wires 5a and 5b, and an opening of the package 6 are hermetically sealed with a cap (lid). The piezoelectric substrate 1 is a rotated Y-cut quartz plate having a cut angle θ which is set to about an angle rotated by −50° counterclockwise from a Z crystalline axis and having an SAW propagation direction which is set to a direction of 90°±5° approximately perpendicular to an X crystalline axis. Here, the excited SAW is an SH wave. Materials for forming electrodes of the IDT 2 and the grating reflectors 3a and 3b are Al or an alloy containing Al as a main component. FIG. 1B is a cross sectional view of the IDT 2. In the later-described embodiments, when a wavelength of the SAW excited on the IDT 2 is denoted by λ, an electrode film thickness is denoted by H/λ which is normalized with the wavelength, and a line occupancy rate mr is denoted by L/S, that is, an electrode finger width L/(electrode finger width L+ electrode finger spacing S).

In the invention, by taking into consideration shortcomings of in the related art, the electrode film thickness H/λ is set to a large value in comparison to the related art, so that the SAW can be concentrated on a surface of the piezoelectric substrate. Accordingly, since reflection of the SAW can be efficiently utilized in the grating reflectors, SAW energy can be held within the IDT by using a small number of IDT pairs or smaller number of grating reflectors, so that it is possible to implement a small-sized SAW device.

Figures 2A, 2B:
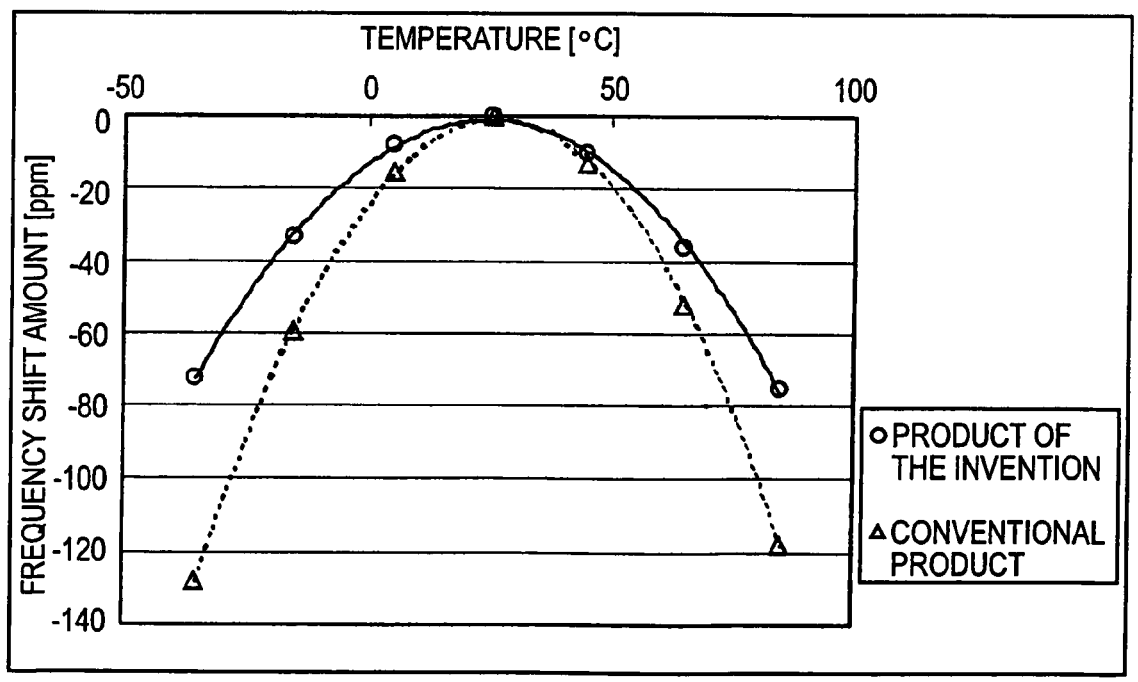
FIG. 2A is a table showing comparisons of Q value, figure of merit, and secondary temperature coefficient as comparisons of the SAW resonator according to the invention to a product thereof in the related art.
FIG. 2B is a graph showing a comparison of frequency temperature characteristics as a comparison of the SAW resonator according to the invention to a product thereof in the related art.

In general, for optimal design of an SAW resonator, excellent frequency temperature characteristics, a high Q value, and a low capacitance ratio γ, that is, a large figure-of-merit (Q/γ) are important factors. Here, several characteristics of the SAW resonator according to the invention are tested. FIGS. 2A and 2B show several characteristics of the SAW resonator shown in FIGS. 1A and 1B when a quartz plate having −51° rotated Y-cut and 90° X propagation (0°, 39°, and 90° in the Euler angle notation) is used on the piezoelectric substrate 1, and a resonance frequency, the electrode film thickness H/λ, the number of IDT pairs 2, and the number of the grating reflectors 3a and 3b are set to 315 MHz, 0.06, 100, and 100, respectively. In addition, FIG. 2A shows a Q value, a figure-of-merit, and a secondary temperature coefficient of an actual product sample, and FIG. 2B shows frequency temperature characteristics thereof. For comparison, the figures shows several characteristics of a product of an ST cut quartz SAW resonator in the related art including a piezoelectric substrate having the same size as the invention.

As shown in FIGS. 2A and 2B, in comparison to the ST cut quartz SAW resonator in the related art, the SAW resonator according to the invention has a Q value of 1.8 multiple and a figure-of-merit of about twice. In addition, with respect to the frequency temperature characteristics, the SAW resonator according to the invention has a peak temperature Tp of about +25° C., that is, the room temperature and a secondary temperature coefficient of about 0.6 multiple of that of the SAW resonator in the related art. Therefore, it can be understood that the SAW resonator according to the invention has excellent effects.

In addition, in the SAW resonator according to the invention, the size of the piezoelectric substrate can be reduced while sustaining a high Q value in comparison the ST cut quartz SAW resonator. This is because an increasing amount of reflection of SAW in the IDTs or the grate reflectors according to the increase in the electrode film thickness H/λ of the SAW resonator according to the invention is much larger than that of the ST cut quartz SAW resonator. Namely, in the SAW resonator according to the invention, by increasing the electrode film thickness H/λ, it is possible to obtain a high Q value with a smaller number of IDTs or grating reflectors than that of the ST cut quartz SAW resonator.

Figure 3A:
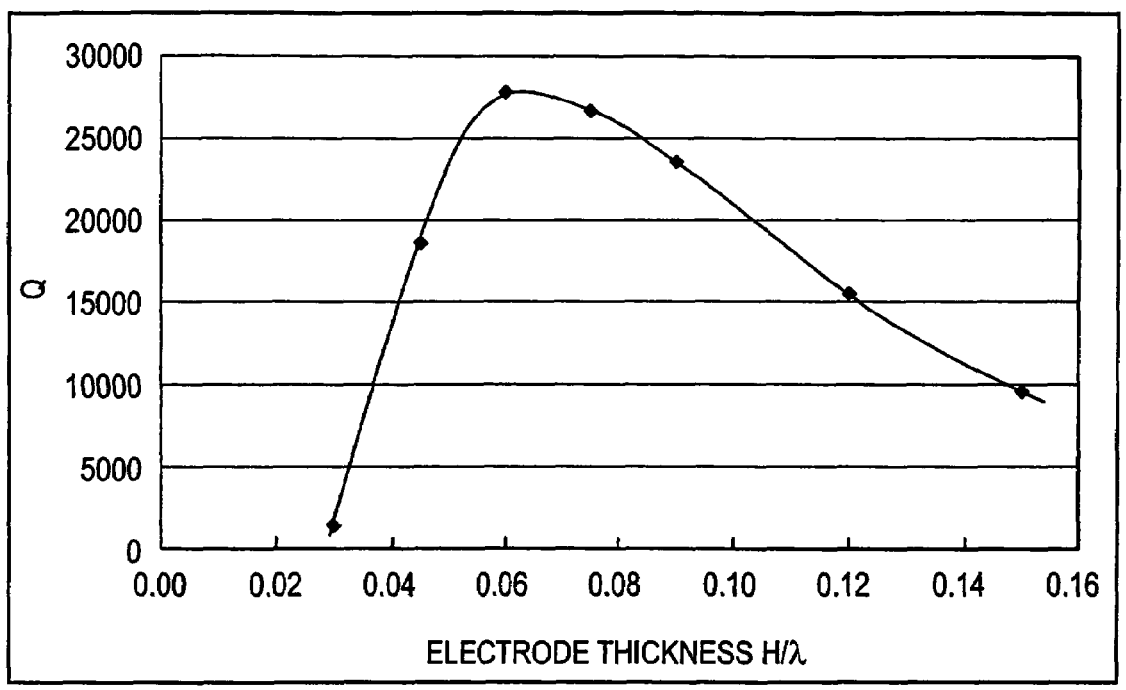
FIG. 3A is a graph showing a relation between an electrode film thickness H/λ and a Q value of the SAW resonator according to the invention.

FIG. 3A is a graph showing a relation between the electrode film thickness H/λ and the Q value of the SAW resonator according to the invention in the same design conductions as the aforementioned resonator. Referring to the figure, it can be understood that the Q value of the SAW resonator according to the invention exceeds the Q value (=15000) of the ST cut quartz SAW resonator in a range of 0.04<H/λ<0.12. In addition, in a range of 0.05<H/λ<0.10, a high Q value more than 20000 can be obtained.

By comparing the Q value of the SAW resonator according to the invention to that of a multiple-pair IDT type SAW resonator disclosed in JP-B-01-034411, the Q value obtained in JP-B-01-034411 corresponds to a resonance frequency of 207.561 MHz, and since the Q value can be evaluated as 15000 at a resonance frequency 315 MHz employed in the invention, the Q value is approximated equal to that of the ST cut quartz SAW resonator. In addition, by comparing sizes of the resonator, the multiple-pair IDT type SAW resonator disclosed in JP-B-01-034411 requires the number of pairs of 800±200, and on the contrary, the SAW resonator according to the invention requires 200 pairs as the sufficient numbers of the IDTs and the grating reflectors, so that it is possible to implement a small-sized SAW resonator. Accordingly, by setting the electrode film thickness to 0.04<H/λ<0.12, and more preferably, to 0.05<H/λ<0.10 and increasing SAW reflection efficiency with the grating reflectors, it is possible to implement a SAW device having a smaller size and a higher Q value than the multiple-pair IDT type SAW resonator disclosed in JP-B-01-034411.

Figure 3B:
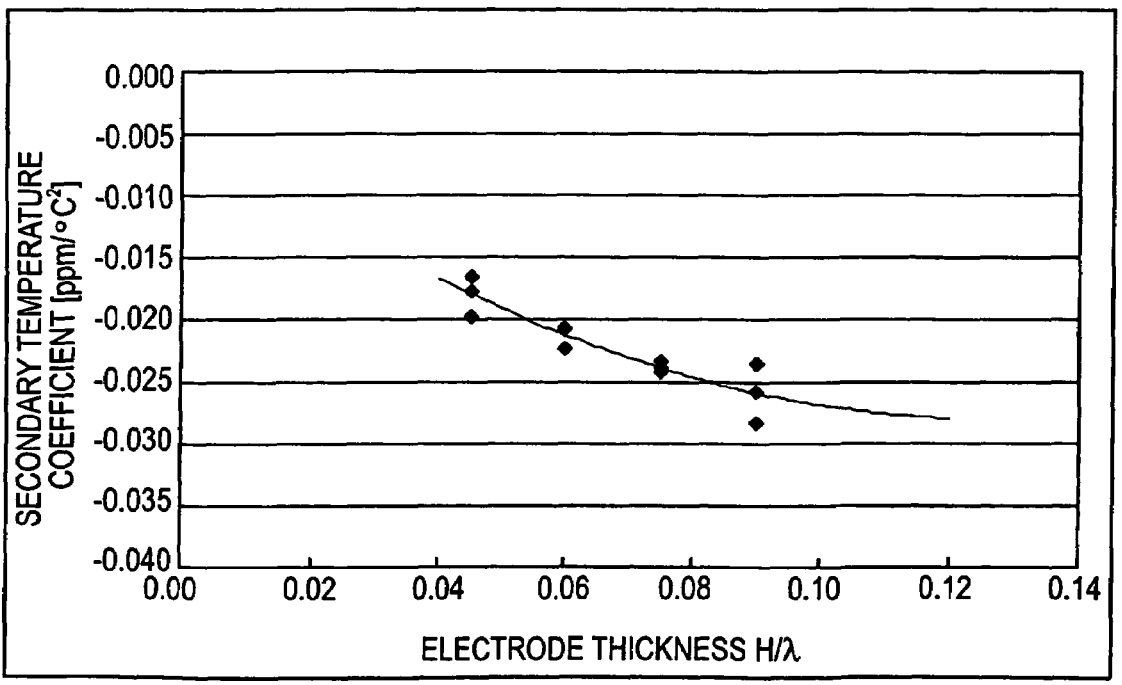
FIG. 3B is a graph showing a relation between an electrode film thickness H/λ and a secondary temperature coefficient.

FIG. 3B is a graph showing a relation between the electrode film thickness H/λ and the secondary temperature coefficient of the electrode film thickness H/λ in the same design conditions as the aforementioned resonator. Referring to the figure, it can be understood that the secondary temperature coefficient of the SAW resonator according to the invention is better than the secondary temperature coefficient of −0.034 ppm/° C.$^2$ of the ST cut quartz SAW resonator in a range of 0.04<H/λ<0.12 where a high Q value is obtained.

Accordingly, by setting the electrode film thickness H/λ in a range of 0.04<H/λ<0.12, it is possible to implement a SAW device having a smaller size, a higher Q value, and a better frequency stability than those of the ST cut quartz SAW device and the resonator disclosed in JP-B-01-034411.

Although a case where the cut angle θ is set to −51° is described above, in the SAW resonator according to the invention, the film thickness dependency can not greatly vary according to change in the cut angle θ, and even in a cut angle θ deviated by several degrees from −51°, by setting the electrode film thickness in a range of 0.04<H/λ<0.12, more preferably, 0.05<H/λ<0.10, it is possible to obtain a high Q value and secondary temperature coefficient.

However, the peak temperature Tp of the frequency temperature characteristics of the SAW resonator varies according to the electrode film thickness H/λ or the cut angle θ of the piezoelectric substrate. Therefore, even though the frequency temperature characteristics are good, if the peak temperature Tp exists outside a usage temperature range, the frequency stability greatly deteriorates. In order to obtain excellent frequency stability in a practical usage temperature range, it is necessary to scrutinize the peak temperature Tp as well as the secondary temperature coefficient.

Figure 4:
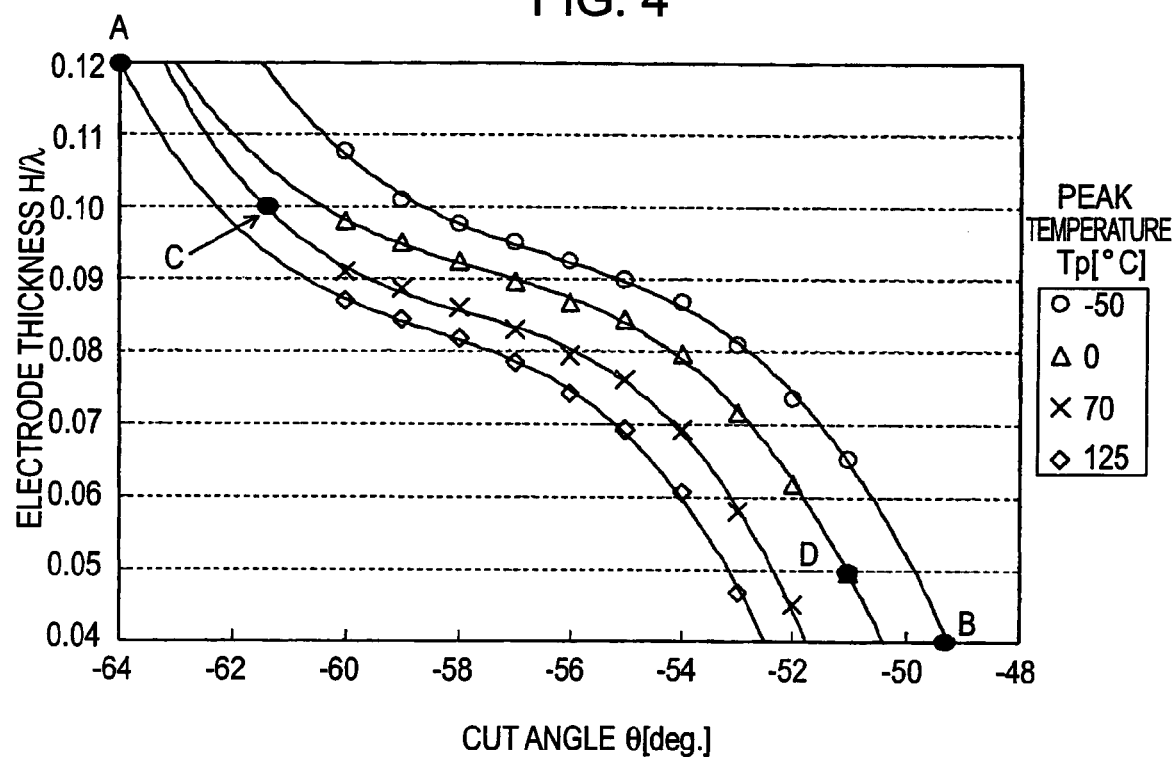
FIG. 4 is a graph showing a relation between a cut angle θ and an electrode film thickness H/λ when a peak temperature Tp (° C.) of the SAW resonator according to the invention is Tp=−50, 0, +70, and +125.

FIG. 4 is a graph showing a result of simulation for calculating a relation between the cut angle θ and the electrode film thickness H/λ of a quartz plate when the peak temperature Tp (° C.) is Tp=−50, 0, +70, and +125 according to the results of the aforementioned several test production experiments. Approximate equations for the Tp characteristics are as follows.

$Tp=-50$ (° C.): $H/\lambda \approx -1.02586 \times 10^{-4} \times \theta^3 - 1.73238 \times 10^{-2} \times \theta^2 - 0.977607 \times \theta - 18.3420$ $Tp=0$ (° C.): $H/\lambda \approx -9.87591 \times 10^{-5} \times \theta^3 - 1.70304 \times 10^{-2} \times \theta^2 - 0.981173 \times \theta - 18.7946$ $Tp=+70$ (° C.): $H/\lambda \approx -1.44605 \times 10^{-4} \times \theta^3 - 2.50690 \times 10^{-2} \times \theta^2 - 1.45086 \times \theta - 27.9464$ $Tp=+125$ (° C.): $H/\lambda \approx -1.34082 \times 10^{-4} \times \theta^3 - 2.34969 \times 10^{-2} \times \theta^2 - 1.37506 \times \theta - 22.7895$ Referring to FIG. 4, it can be understood that, in order to set the peak temperature Tp (° C.) in a practical range of −50≦Tp≦+125, the cut angle θ and the electrode film thickness H/λ may be set to a region surrounded by curves of Tp=−50° C. and Tp=+125° C., that is, $-1.34082 \times 10^{-4} \times \theta^3 - 2.34969 \times 10^{-2} \times \theta^2 - 1.37506 \times \theta - 26.7895 < H/\lambda < -1.02586 \times 10^{-4} \times \theta^3 - 1.73238 \times 10^{-2} \times \theta^2 - 0.977607 \times \theta - 18.3420$. Here, the range of electrode film thickness H/λ is assumed to be 0.04<H/λ<0.12 where better characteristics than those of the ST cut quartz device are obtained, and the range of the cut angle θ is assumed to be −64.0°<θ<−49.3° which are denoted by points A and B in FIG. 4.

In addition, as an optimal condition, it is preferable that, the peak temperature Tp (° C.) is set to a more practical usage temperature range of 0≦Tp≦+70. In order to set the Tp (° C.) to the aforementioned range, the cut angle θ and the electrode film thickness H/λ may be set to a region surrounded by curves of Tp=−0° C. and Tp=+70° C., that is, $-1.44605 \times 10^{-4} \times \theta^3 - 2.50690 \times 10^{-2} \times \theta^2 - 1.45086 \times \theta - 27.9464 < H/\lambda < -9.87591 \times 10^{-5} \times \theta^3 - 1.70304 \times 10^{-2} \times \theta^2 - 0.981173 \times \theta - 18.7946$. In addition, it is preferable that the electrode film thickness H/λ is set to a range of 0.05<H/λ<0.10 where a Q value of 20000 or more is obtained, and in order to set the electrode film thickness and the peak temperature Tp (° C.) to the aforementioned range and the range of 0≦Tp≦+70, respectively, the cut angle θ may be set to a range of −61.4<θ<−51.1 which are denoted by points C to D.

According to the above result, it can be seen that, by using a rotated Y-cut quartz plate having the cut angle θ of −64.0°<θ<−49.3°, preferably, −61.4°<θ<−51.1°, using an SH wave which is an SAW excited in a propagation direction approximately perpendicular to the X axis, constructing the IDTs or the grating reflectors with electrode materials of Al or an alloy containing Al as a main component, and setting the electrode film thickness H/λ to a range of 0.04<H/λ<0.12, preferably, 0.05<H/λ<0.10, it is possible to obtain a higher Q value and better temperature characteristics than those of the ST cut quartz SAW device and to set the peak temperature Tp to a practical usage temperature range.

Now, a relation between the line occupancy rate mr and the capacitance ratio γ of the SAW resonator will be described. As described above, a higher performance of the device can be obtained by reducing the capacitance ratio γ. However, the capacitance ratio γ varies according to a value of the line occupancy rate mr of the IDT. Therefore, the line occupancy rate mr must be selected so as to obtain an optimal capacitance ratio γ.

FIG. 5A shows the relation between the line occupancy rate mr and the capacitance ratio γ of the SAW resonator. The figure shows experimental values. In the experiment, the cut angle θ of the quartz plate is −52.0°, and electrode film thickness H/λ changes by 0.01 pitch in a range of 0.04 to 0.08, and the line occupancy rate mr of the IDT changes by 0.1 pitch in a range of 0.4 to 0.8. In addition, the line occupancy rate of the grating reflector changes in a manner similar to that of the IDT. Referring to the figure, it can be understood that the capacitance ratio γ has a downwardly convex quadratic curve with respect to the line occupancy rate mr.

In addition, FIG. 5B shows line occupancy rates mr at minimum capacitance ratios γ in conditions of the electrode film thickness H/λ. It can be seen that, when the electrode film thickness H/λ is set to in a range of 0.04≦H/λ≦0.08, the capacitance ratio γ has a substantially lowest value by setting the line occupancy rate mr to a range of 0.58≦mr≦0.60. Practically, referring to the curve of FIG. 5A, the capacitance ratio γ can be satisfactorily reduced by setting the line occupancy rate mr to a range of 0.53≦mr≦0.65.

Accordingly, in the SAW device according to the invention, it can be understood that, by setting the line occupancy rate mr of the IDT to a range of 0.53≦mr≦0.65, it is possible to obtain a small size and excellent frequency temperature characteristics and to reduce the capacitance ratio γ.

However, since there is a production error in the line occupancy rate mr, it is difficult to accurately control the line occupancy rate mr. If the line occupancy rate mr is not uniform, the frequency variation occurs, so that there is a problem in that production yield is reduced. Therefore, it is preferable to select a line occupancy rate mr which causes a small frequency variation even in a case where the line occupancy rate mr is not uniform, that is, a line occupancy rate mr having excellent frequency control performance. Hereinafter, the line occupancy rate mr and the frequency control performance will be described.

Figures 6A, 6B:
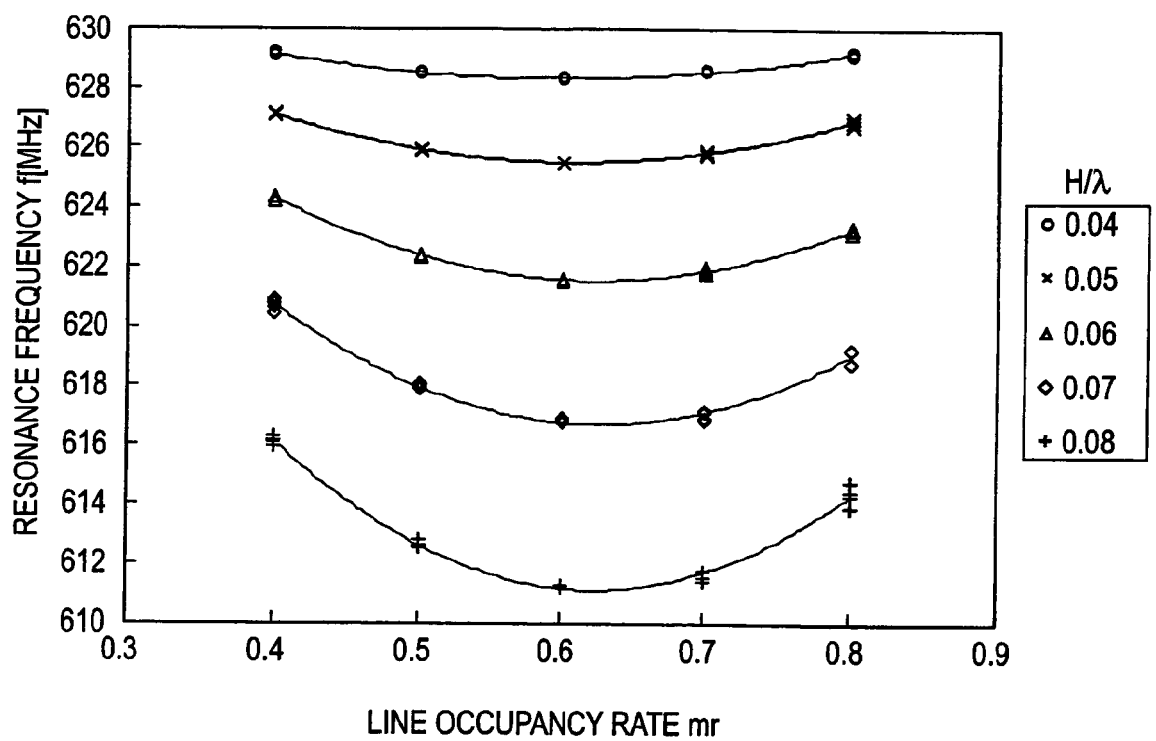
FIG. 6A is a graph showing a relation between a line occupancy rate mr and a resonance frequency f when an electrode film thickness H/λ of the SAW resonator according to the invention changes.
FIG. 6B is a table showing line occupancy rates mr at lowest resonance frequency f in conditions of the electrode film thickness H/λ.

FIG. 6A shows a relation between the line occupancy rate mr and the resonance frequency f of the SAW resonator. The figure shows experimental values. In the experiment, the cut angle θ of the quartz plate is −52.0°, and the electrode film thickness H/λ changes by 0.01 pitch in a range of 0.04 to 0.08, and the line occupancy rate mr of the IDT changes by 0.1 pitch in a range of 0.4 to 0.8. In addition, the line occupancy rate of the grating reflector changes in a similar manner as that of the IDT. Referring to FIG. 6A, it can be understood that the resonance frequency f has a downwardly convex quadratic curve with respect to the line occupancy rate mr.

In addition, FIG. 6B shows line occupancy rates mr at lowest resonance frequency f in conditions of the electrode film thickness H/λ. It can be seen that, when the electrode film thickness H/λ is set to in a range of $0.04 \leq H/\lambda \leq 0.08$, the resonance frequency f has a lowest value by setting the line occupancy rate mr to a range of $0.60 \leq mr \leq 0.63$. Practically, referring to the curve of FIG. 6A, if the line occupancy rate mr is set to a range of $0.55 \leq mr \leq 0.68$, the frequency variation can be suppressed, and the resonance frequency f dose not greatly vary even in a case where the line occupancy rate mr is not uniform, so that it is possible to implement a SAW device having excellent frequency control performance.

According to the above result, it can be seen that, by using a rotated Y-cut quartz plate having the cut angle θ of −64.0°<θ<−49.3°, preferably, −61.4°<θ<−51.1° rotated counterclockwise from a Z crystalline axis, using an SH wave which is an SAW excited in a propagation direction perpendicular to the X axis, allowing the SH wave to propagate along a vicinity of the surface of the substrate, constructing the IDTs with Al or an alloy containing Al as a main component, and setting the electrode film thickness H/λ to a range of 0.04<H/λ<0.12, preferably, 0.05<H/λ<0.10, it is possible to implement a SAW device having a high Q value and excellent frequency temperature characteristics. In addition, it can be seen that, by setting the line occupancy rate to a range of $0.53 \leq mr \leq 0.65$, it is possible to reduce the capacitance ratio γ. In addition, it can be seen that, by setting the line occupancy rate mr to a range of $0.55 \leq mr \leq 0.68$, it is possible to obtain excellent frequency control performance.

In addition, by setting the line occupancy rate mr to a range of $0.55 \leq mr \leq 0.65$ which is an overlapping range of the range ($0.53 \leq mr \leq 0.65$) of the line occupancy rate mr in which the capacitance ratio γ can be reduced and the range ($0.55 \leq mr \leq 0.68$) of the line occupancy rate mr in which the excellent frequency control performance can be obtained, it is possible to implement a SAW device having both of the optimal capacitance ratio γ and the excellent frequency control performance.

In addition, in an actual production of a SAW device, it is difficult to accurately adjust the line occupancy rate mr, and there is a deviation of about ±0.05 due to production error and measurement error. However, in the SAW device according to the invention, in such a deviation, it is possible to obtain the aforementioned advantages.

Now, another embodiment of the invention will be described. The aforementioned conceivable SAW device has a problem in that, as a result of an electrical conduction test using a SAW resonator having a resonance frequency of 433 MHz, frequency variation is larger than that of a ST cut quartz SAW device in the related art. For the reason, in the aforementioned conceivable SAW device, the electrode film thickness of the SAW device is designed to be larger than that of the ST cut quartz device in the related art. However, when the electrode film thickness increases, stress to the film increases during the film forming process. Accordingly, there occurs stress migration that Al atoms migrates so as to alleviate the stress, so that frequency variation increases.

Figure 7:
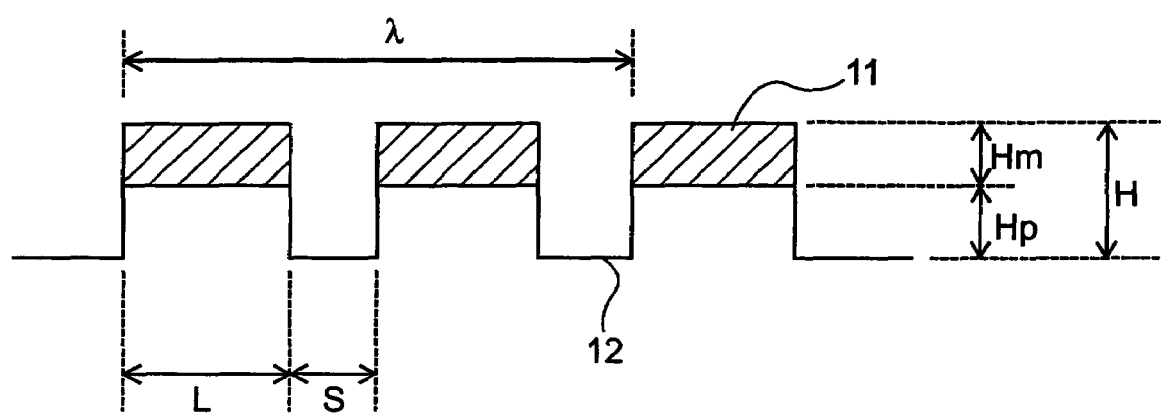
FIG. 7 is a view for explaining another embodiment of the invention.

In order to solve the aforementioned problem, a SAW device shown in FIG. 7 is contrived. Similarly to FIG. 1, in the SAW device shown in the figure, IDTs constructed with a metal film made of Al or an alloy containing Al as a main component are disposed on a piezoelectric substrate. In addition, an SH wave is used as an excitation wave, and a quartz plate having a cut angle θ of a rotated Y-cut quartz plate set to a range of −64.0°<θ<−49.3° rotated counterclockwise from the Z crystalline axis and a SAW propagation direction set to a direction of 90°±5° with respect to the X crystalline axis is used. In addition, grooves 12 are formed on a surface of the quart plate in spaces between electrode fingers of the IDTs. Namely, when the depths of the grooves 12 of the quartz plate and the thickness of the metal film 11 are denoted by Hp and Hm, respectively, the electrode film thickness H of the outer appearance thereof becomes (Hp+Hm), and since the film thickness of the film can be reduced due to the formation of the grooves, the frequency variation caused by the stress migration during the electrical conduction can be suppressed. Here, when the electrode film thickness H/λ normalized with an wavelength λ of the SAW is set to a range of 0.04<H/λ<0.12, it is possible to implement a SAW device having a higher Q value and better frequency temperature characteristics than those of the ST cut quartz device in the aforementioned conceivable SAW device in the related art.

In a method of manufacturing the SAW resonator, after a electrode pattern made of Al or an alloy containing Al as a main component is formed on a quartz plate, a sputtering process is performed in a $CF_4$ gas ambience to etch the surface of the quart pate in the spaces between the electrode fingers, so that the grooves are formed. The etch rate to Al is lower than that of quartz, and the Al electrode can be used as a mask for forming the grooves, so that it is possible to easily form the grooves.

According to an test production experiment where the depth HP of the grooves of the quartz plate and the film thickness Hm of the metal film are set to 0.03λ and 0.03λ, respectively to form the electrode film thickness H (=Hp+Hm) of 0.06λ, it can be seen that the frequency variation during the electrical conduction can be further reduced in comparison to a case where the electrode film thickness of 0.06λ is formed by using only the metal film.

As described above, in the structure according to the embodiment, since the film thickness of the film is reduced by forming the grooves in the spaces between the electrode fingers, it is possible to implement a SAW device capable of suppressing the frequency variation during the electrical conduction and having a high Q value and excellent frequency temperature characteristics.

Although the above description is made with reference to a one-port SAW resonator shown in FIG. 1, the invention may be applied to other SAW devices. Hereinafter, structures of various SAW devices will be described.

Figure 8:
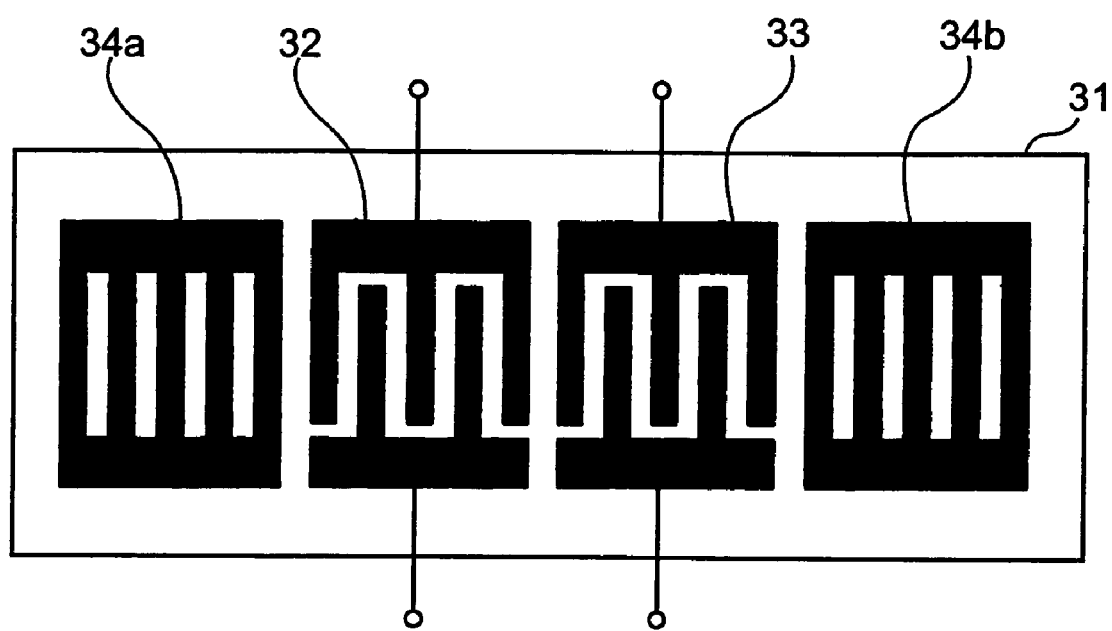
FIG. 8 is a view for explaining a two-port SAW resonator according to the invention.

FIG. 8 shows a two-port SAW resonator where IDTs 32 and 33 are disposed on a piezoelectric substrate 31 in an SAW propagation direction, and grating reflectors 34a and 34b are disposed at sides there. Similarly to the one-port SAW resonator, it is possible to obtain a high Q value.

Figure 9A:
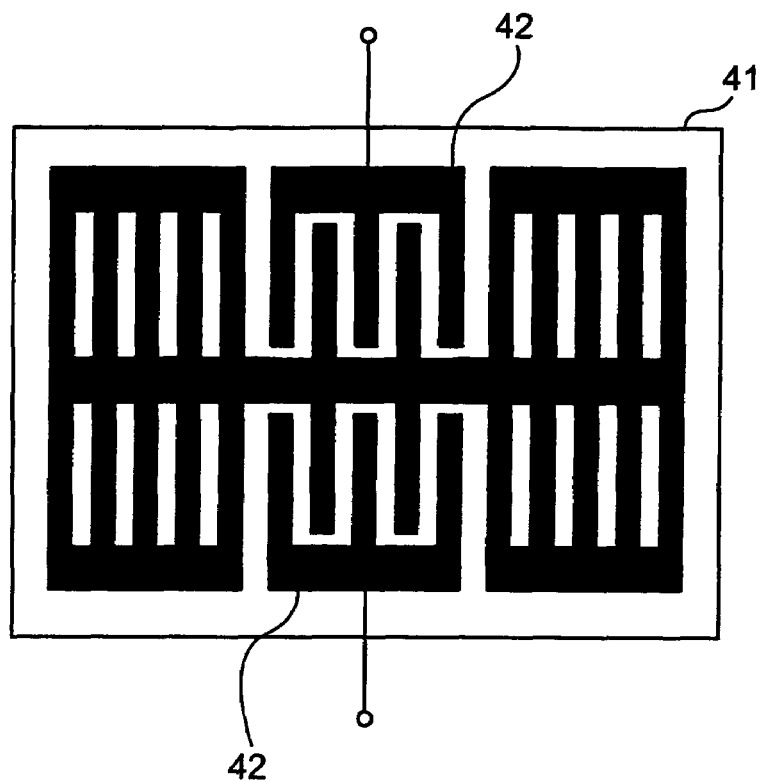
FIG. 9A is a view for explaining a transverse coupling type DMS filter according to the invention.
Figure 9B:
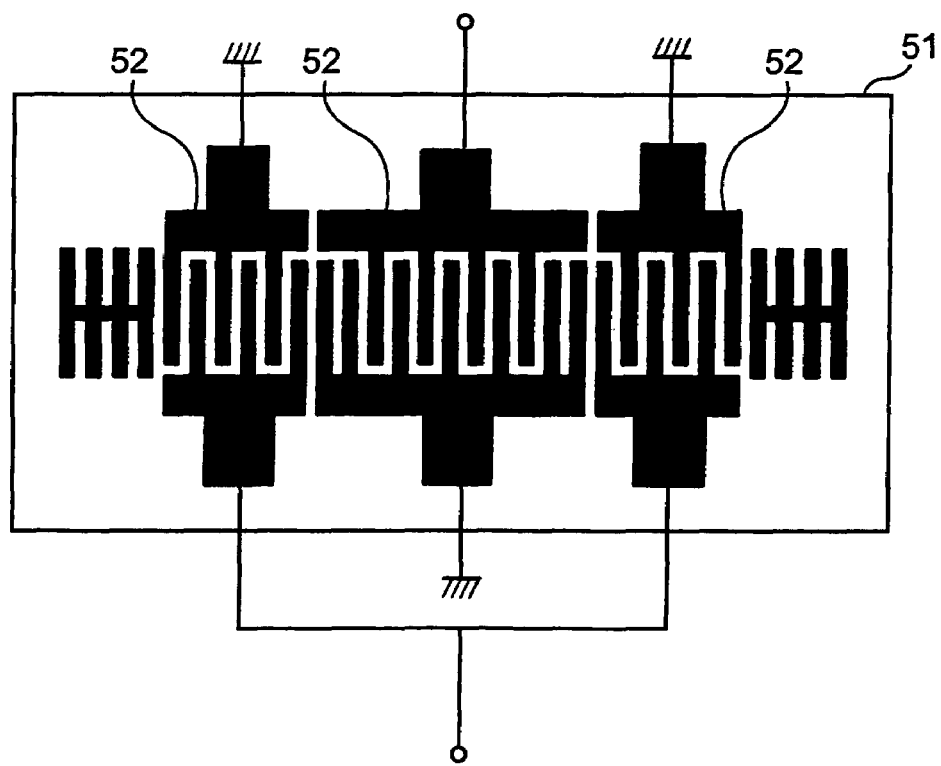
FIG. 9B is a view for explaining a longitudinal coupling type DMS filter according to the invention.

FIGS. 9A and 9B show double-mode SAW (DMS) filters which are one type of resonator filters and uses acoustic coupling of the SAW resonator. FIG. 9A shows a transverse coupling type DMS filter where the SAW resonators 42 are disposed to be closely and parallel to the probation direction on the piezoelectric substrate 41, and FIG. 9B shows a two-port longitudinal coupling type DMS filter where the SAW resonators constructed with the IDTs 52 are disposed in the propagation direction on a piezoelectric substrate 51. The transverse coupling type DMS filter uses the acoustic coupling in a vertical direction of the propagation direction, and the longitudinal coupling type DMS filter uses the acoustic coupling in a horizontal direction of the propagation direction. These DMS filters have a characteristic capable of obtaining a flat pass band and a good out-band suppression degree. In addition, the longitudinal coupling type DMS filter may be connected to the SAW resonator in order to obtain high attenuation characteristics at a vicinity of the pass band. In addition, the DMS filter may be applied to a multiple-mode SAW filter using higher-order modes or a multiple-mode SAW filter using acoustic coupling in vertical and horizontal directions of the propagation direction.

Figure 10:
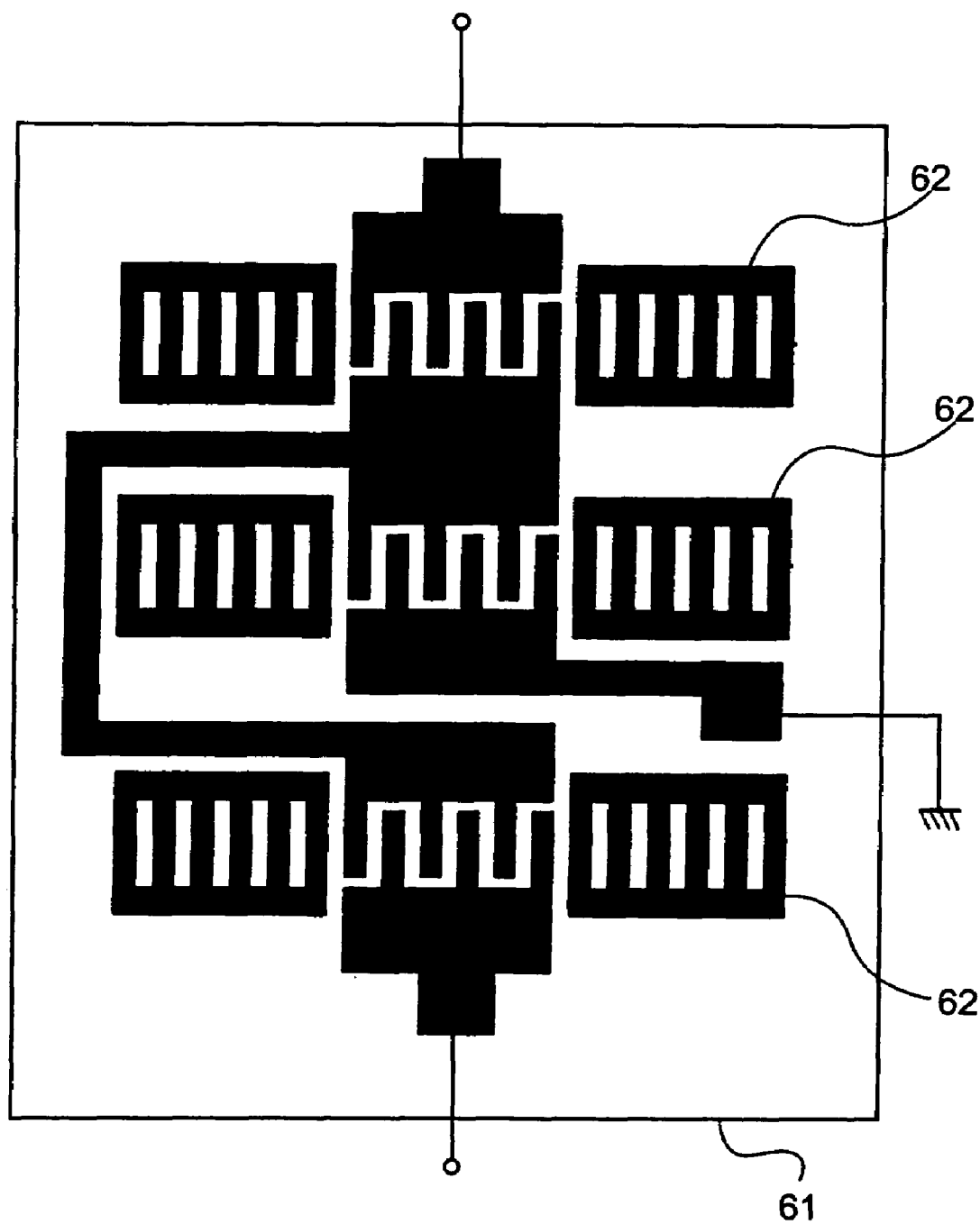
FIG. 10 is a view for explaining a ladder-type SAW filter according to the invention.

FIG. 10 shows another resonator filter, that is, a ladder-type SAW filter where a plurality of one-port SAW resonators 62 are disposed in a serial, parallel, or ladder shape on a piezoelectric substrate 61. The ladder-type SAW filter can obtain filter characteristics having a rapid attenuation gradient at a vicinity of pass band in comparison to the aforementioned DMS filter.

Figure 11A:
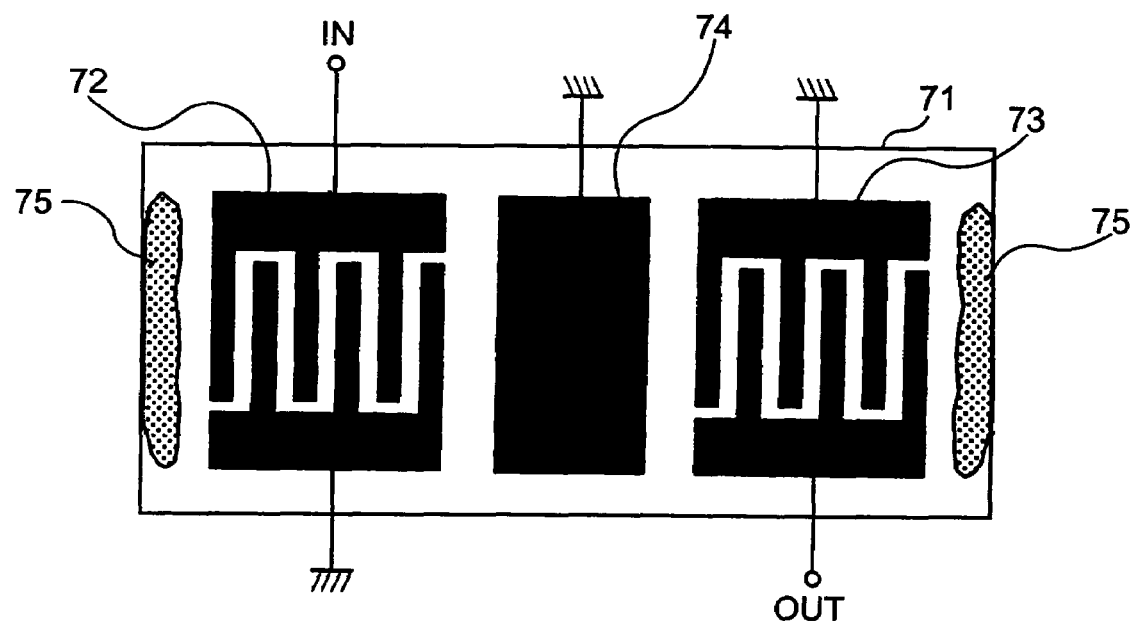
FIG. 11A shows a transversal SAW filter according to the invention where an IDT exciting a SAW in a bi-directional manner is disposed.
Figure 11B:
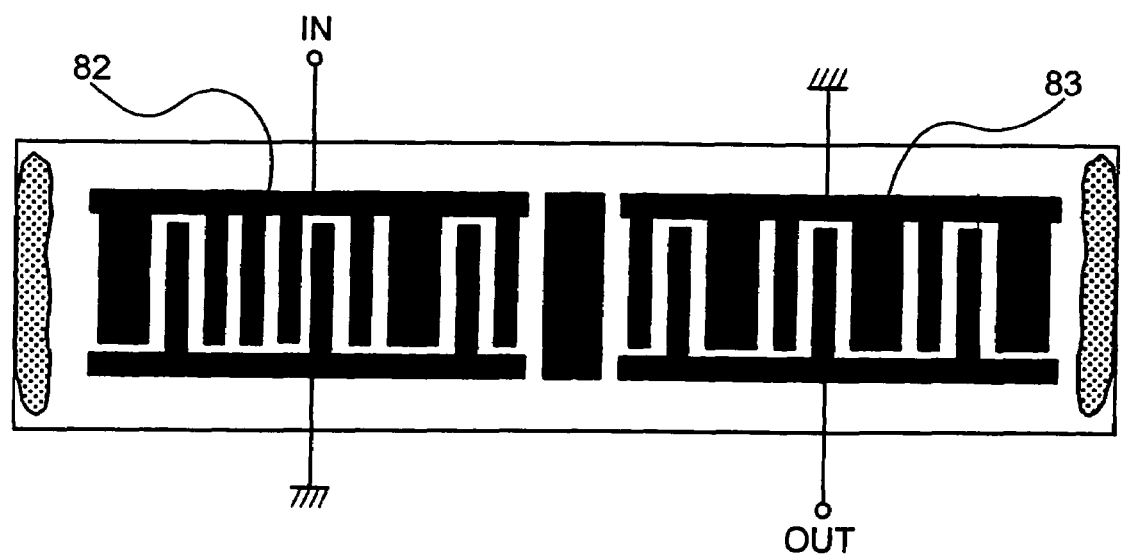
FIG. 11B shows a transversal SAW filter according to the invention where an IDT exciting a SAW in a uni-directional manner is disposed.
Figure 12:
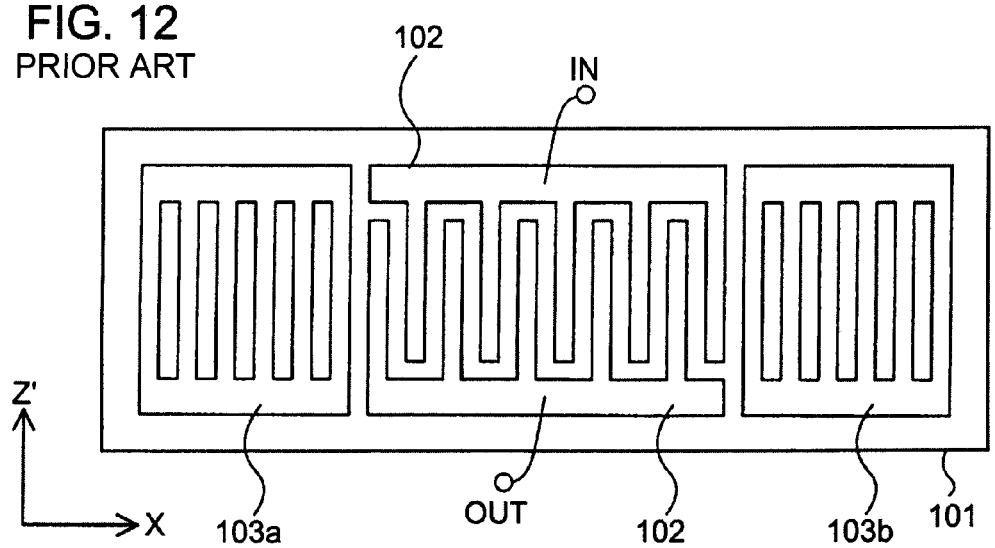
FIG. 12 is view for explaining a ST cut quartz SAW resonator in the related art.
Figure 13A:
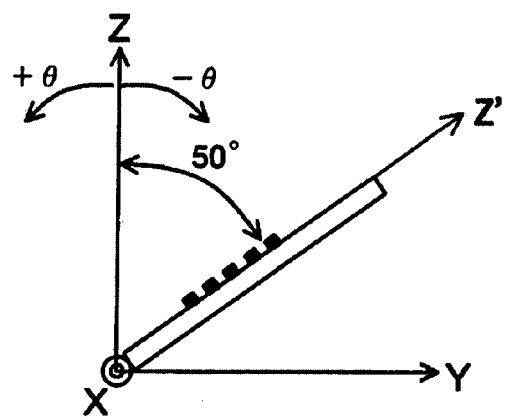
FIG. 13 is a view for explaining a quartz plate having −50° rotated Y-cut and 90° X propagation.
Figure 13B:
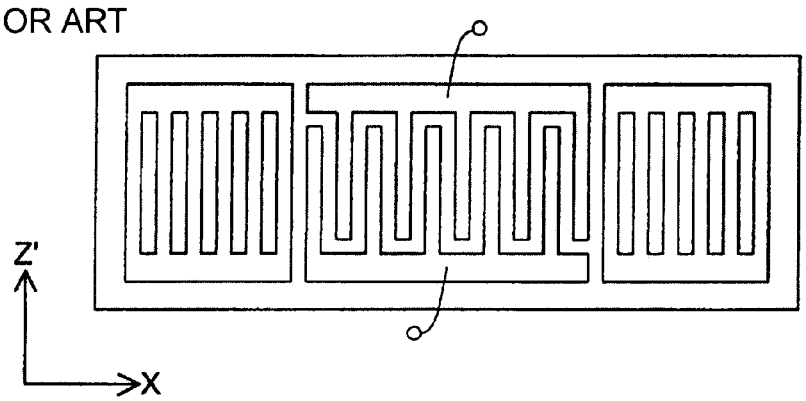
Figure 14:
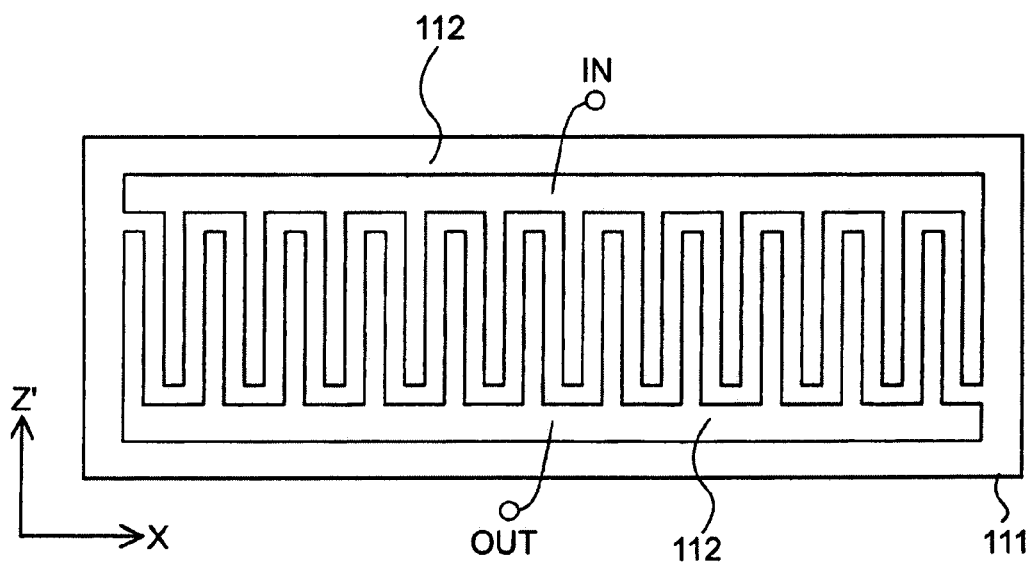
FIG. 14 is a view for explaining a multiple-pair IDT type SAW resonator in the related art.
Figure 15:
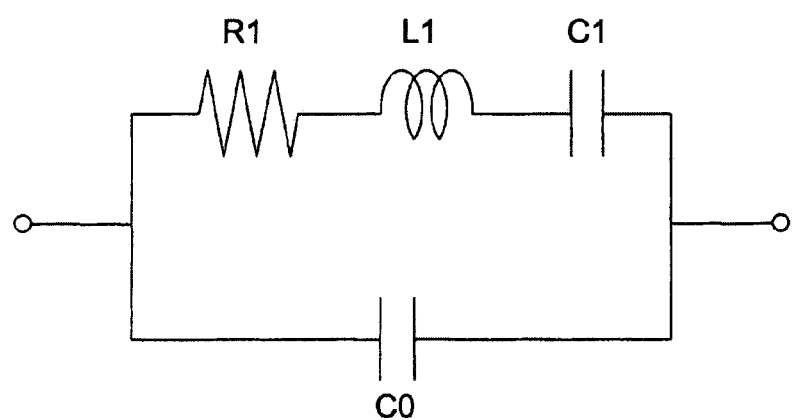
FIG. 15 is an equivalent circuit diagram of a SAW resonator.

FIGS. 11A and 11B show a transversal SAW filter. Referring to FIG. 11A, input IDTs 72 and output IDTs 73 are disposed in a predetermined interval in an SAW propagation direction on a piezoelectric substrate 71. In addition, the IDTs 72 and 73 excites the SAW in a bi-directional manner. In order to prevent influence of a direct delivery wave between the input and output ports, a shield electrode 74 may be disposed. In addition, in order to suppress an unnecessary reflecting wave from distal ends of the plate, sound absorbing materials may be coated on ends of the piezoelectric substrate 71. In the transversal SAW filter, amplitude and phase characteristics can be individually designed, and an out-band suppression degree is high, so that the transversal SAW filter is widely used as an IF filter.

In the transversal SAW filter, the SAW propagates equally in left and right propagation directions, so that there is a problem in that insertion lose of a filter increases. In order to solve the problem, as shown in FIG. 11B, there is a transversal SAW filter where single phase uni-directional transducers (SPUDTs) 82 and 83 which obtain uni-directionally excited SAW by providing weights to excitation and reflection of the SAW by means of changing electrode finger arrangement or electrode finger widths are disposed. Since the SAW has the uni-directional excitation, it is possible to obtain low loss filter characteristics. In addition, as still another structure, there is a so-called reflection bank type transversal SAW filter where grating reflectors are disposed between excitation electrodes of the IDTs.

In the aforementioned various SAW devices, it is obvious that, by constructing the SAW device using a rotated Y-cut quartz plate having a cut angle θ set to a range of −64.0°<θ<−49.3°, preferably, of −61.4°<θ<−51.1° rotated counterclockwise from a Z crystalline axis, setting a propagation direction of the SAW to a direction perpendicular to an X axis, using an SH wave propagating along a vicinity of a surface of the plate as an excited SAW, constructing IDTs with Al or an alloy containing Al as a main component, and setting an electrode film thickness H/λ normalized with a wavelength λ of the SAW to a range of 0.04<H/λ<0.12, preferably, 0.05<H/λ<0.10, it is possible to obtain a high Q value and excellent frequency temperature characteristics. It is obvious that, by setting a line occupancy rate mr of the IDT to a range of $0.53 \leq mr \leq 0.65$, it is possible to reduce the capacitance ratio γ. In addition, it is obvious that, by setting the line occupancy rate mr to a range of $0.55 \leq mr \leq 0.68$, it is possible to obtain excellent frequency control performance. In addition, by forming the grooves in the spaces between the electrode fingers of the IDTs and setting the electrode film thickness H/λ normalized with the wavelength λ of the SAW to a range of 0.04<H/λ<0.12 (H=Hp+Hm) when the depth of the groove and the film thickness of the metal film are denoted by Hp and Hm, respectively, it is possible to implement a SAW device capable of suppressing the frequency variation caused by the stress migration during the electrical conduction and having a high Q value and excellent frequency temperature characteristics.

In addition, it is obvious that, even in a case where a protective film of $SiO^2$ or a protective film constructed by performing a positive electrode oxidation on Al is formed on the IDTs or the grating reflector or a case where a closely contacting layer or a metal film having other purposes such as increase in power resistance is formed on an upper or lower portion of the Al electrode, it is possible to obtain advantages similar to those of the invention. In addition, the SAW device according to the invention can be applied to a sensor apparatus, a module apparatus, an oscillating circuit, or the like. In addition, by applying the SAW device according to the invention to a voltage controlled SAW oscillator (VCSO) or the like, the capacitance ratio γ can be reduced, so that it is possible to widen a variable range of frequency.

In addition, as shown in FIG. 1, the SAW device according to the invention may have a structure where an SAW chip and a package are connected with wire bonding. Alternatively, the SAW device according to the invention may have a flip chip bonding (FCB) structure where electrode pads of the SAW chip and the terminals of the package are connected with metal bumps, a chip size package (CSP) structure where the SAW chip on a wire plate is subject to flip chip bonding and circumference of the SAW chip is sealed with a resin, or a wafer level chip size package (WLCSP) where a metal film or a resin layer is formed on the SAW chip in order not to necessitate the package or the wire plate. Moreover, the SAW device according to the invention has an all quartz package (AQP) structure where quartz devices are inserted between quartz or glass plates and stacked and sealed. Since the AQP structure can be constructed by simply inserting the quartz devices between the quartz or glass plates, the package does not necessitate the package, so that it is possible to obtain a small size thereof. In addition, out gas caused by adhesive materials can be reduced by using low melting point glass sealing or direct bonding, so that it is possible to obtain excellent aging characteristics.

What is claimed is:

1. A surface acoustic wave device comprising a piezoelectric substrate, an IDT which is formed on the piezoelectric substrate and made of Al or an alloy containing Al as a main component, and grating reflectors on both sides of the IDT that reflect a surface acoustic wave, the surface acoustic wave device using an SH wave as an excitation wave, wherein the piezoelectric substrate is a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger width/(electrode finger width+electrode finger spacing), the line occupancy rate mr is set to a range of 0.53≦mr≦0.65.

2. A surface acoustic wave device comprising a piezoelectric substrate, an IDT which is formed on the piezoelectric substrate and made of Al or an alloy containing Al as a main component, and grating reflectors on both sides of the IDT that reflect a surface acoustic wave, the surface acoustic wave device using an SH wave as an excitation wave, the piezoelectric substrate being a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger width/(electrode finger width+electrode finger spacing), the line occupancy rate mr is set to a range of 0.55≦mr≦0.68.

3. A surface acoustic wave device comprising a piezoelectric substrate an IDT which is formed on the piezoelectric substrate and made of Al or an alloy containing Al as a main component, and grating reflectors on both sides of the IDT that reflect a surface acoustic wave, the surface acoustic wave device using an SH wave as an excitation wave, the piezoelectric substrate being a rotated Y-cut quartz plate having a cut angle θ set to a range of −64.0°<θ<−49.3° rotated counterclockwise from a Z crystalline axis and a propagation direction of a surface acoustic wave set to a direction of 90°∓5° with respect to an X crystalline axis, wherein, when a wavelength of an excited surface acoustic wave is denoted by λ, an electrode film thickness H/λ normalized with wavelength of the IDT is set to a range of 0.04<H/λ<0.12, and wherein, when a line occupancy rate mr of electrode fingers constituting the IDT is defined to be electrode finger widthl(electrode finger width+electrode finger spacing), the line occupancy rate mr is set to a range of 0.55≦mr≦0.65.

4. The surface acoustic wave device according to claim 1, wherein the cut angle θ is set to a range of −61.4°<θ<−51.1°.

5. The surface acoustic wave device according to claim 1, wherein the electrode film thickness H/λ is set to a range of 0.05<H/λ<0.10.

6. The surface acoustic wave device according to claim 1, wherein the electrode film thickness H/λ is set to a range of 0.04≦H/λ≦0.08.

7. A surface acoustic wave device comprising a piezoelectric substrate, an IDT which is formed on the piezoelectric substrate and made of Al or an alloy containing Al as a main component, and grating reflectors on both sides of the IDT that reflect a surface acoustic wave, the surface acoustic wave device using an SH wave as an excitation wave, the piezoelectric substrate being a rotated Y-cut quartz plate having a cut angle θ set to a range of −64.0°<θ<−49.3° rotated counterclockwise from a Z crystalline axis and a propagation direction of a surface acoustic wave set to a direction of 90°±5° with respect to an X crystalline axis, and wherein grooves are formed in spaces between electrode fingers of the IDT, and when a depth of the grooves and a film thickness of a metal film are denoted by Hp and Hm, respectively, an electrode film thickness H/X normalized with wavelength λ of the surface acoustic wave is set to a range of 0.04<H/λ<0.12 (H=Hp+Hm).

8. A module apparatus or an oscillating circuit using the surface acoustic wave device according to claim 1.

9. The surface acoustic wave device according to claim 2, wherein the cut angle θ is set to a range of −61.4°<θ<−51.1°.

10. The surface acoustic wave device according to claim 3, wherein the cut angle θ is set to a range of −61.4°<θ<−51.1°.

11. The surface acoustic wave device according to claim 2, wherein the electrode film thickness H/λ is set to a range of 0.05<H/λ<0.10.

12. The surface acoustic wave device according to claim 3, wherein the electrode film thickness H/λ is set to a range of 0.05<H/λ<0.10.

13. The surface acoustic wave device according to claim 2, wherein the electrode film thickness H/λ is set to a range of 0.04≦H/λ≦0.08.

14. The surface acoustic wave device according to claim 3, wherein the electrode film thickness H/λ is set to a range of 0.04≦H/λ≦0.08.

15. A module apparatus or an oscillating circuit using the surface acoustic wave device according to claim 2.

16. A module apparatus or an oscillating circuit using the surface acoustic wave device according to claim 3.

17. A module apparatus or an oscillating circuit using the surface acoustic wave device according to claim 7.

* * * * *